United States Patent [19]

Taylor

[11] 4,231,056
[45] Oct. 28, 1980

[54] MOAT RESISTOR RAM CELL

[75] Inventor: David L. Taylor, Melbourne, Fla.

[73] Assignee: Harris Corporation, Melbourne, Fla.

[21] Appl. No.: 953,137

[22] Filed: Oct. 20, 1978

[51] Int. Cl.$^2$ .................. H01L 27/04; H01L 27/12; H01L 27/02
[52] U.S. Cl. .................... 357/50; 357/49; 357/51; 357/59; 357/55; 357/23
[58] Field of Search ............... 357/55, 59, 23, 91, 357/49, 51, 50

[56] References Cited

U.S. PATENT DOCUMENTS

| | | | |
|---|---|---|---|
| 3,456,335 | 7/1969 | Henning et al. | 357/59 |
| 3,911,562 | 10/1975 | Voumans | 357/59 |
| 3,956,033 | 5/1976 | Roberson | 357/59 |
| 3,998,673 | 12/1976 | Chow | 357/59 |
| 4,037,306 | 7/1977 | Gutteridge | 357/55 |
| 4,048,649 | 9/1977 | Bohn | 357/59 |
| 4,085,499 | 4/1978 | Kuninobu | 357/59 |
| 4,110,776 | 8/1978 | Rao et al. | 357/59 |
| 4,149,177 | 4/1979 | Alter | 357/55 |
| 4,157,269 | 6/1979 | Ning et al. | 357/59 |

*Primary Examiner*—Andrew J. James
*Attorney, Agent, or Firm*—Leitner, Palan, Lyman, Martin & Bernstein

[57] ABSTRACT

A RAM cell having a pair of transistors formed in two adjacent wells laterally separated from each other and surrounded laterally by a common doped polycrystalline semiconductor moat. Dielectrical insulation separate the wells from the moat. The moat is discontinuous, forming thereby a pair of resistors connected together at one end and disconnected at the discontinuity. Surface contacts bridge adjacent areas of the well and the moat which are of the same conductivity type whereby the moat forms the load resistor for the transistor. Each transistor includes a second emitter.

First level interconnects include a first interconnect interconnecting an emitter from each transistor, a second interconnect parallel to the first contacting the connected end of the moat resistors, a pair of interconnects each interconnecting the bridge contact of one transistor to the base of the other, and a pair of contacts for the other emitter regions. Second level interconnects include a pair of parallel interconnects connected to a respective emitter contact and orthogonal to the first interconnect.

A method of fabrication is also described.

17 Claims, 5 Drawing Figures

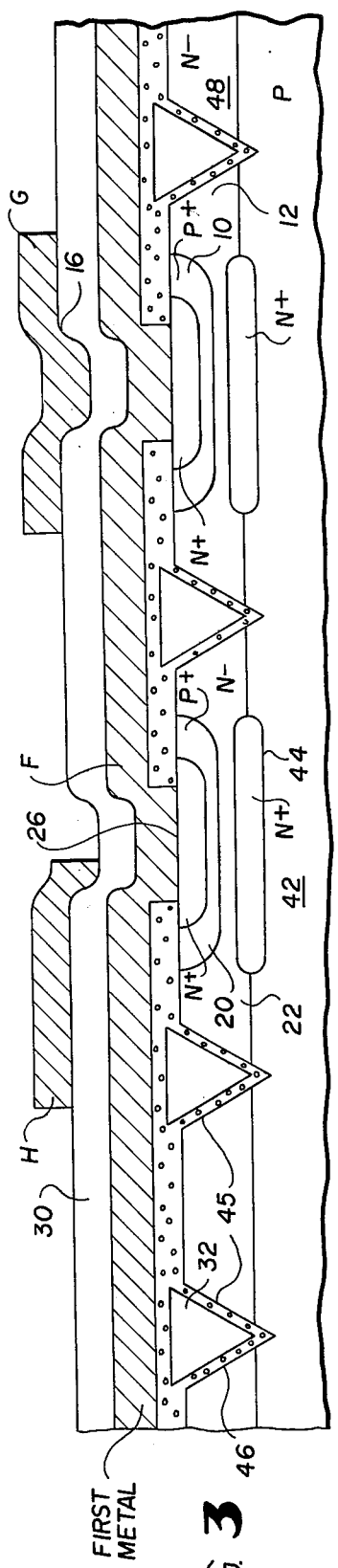
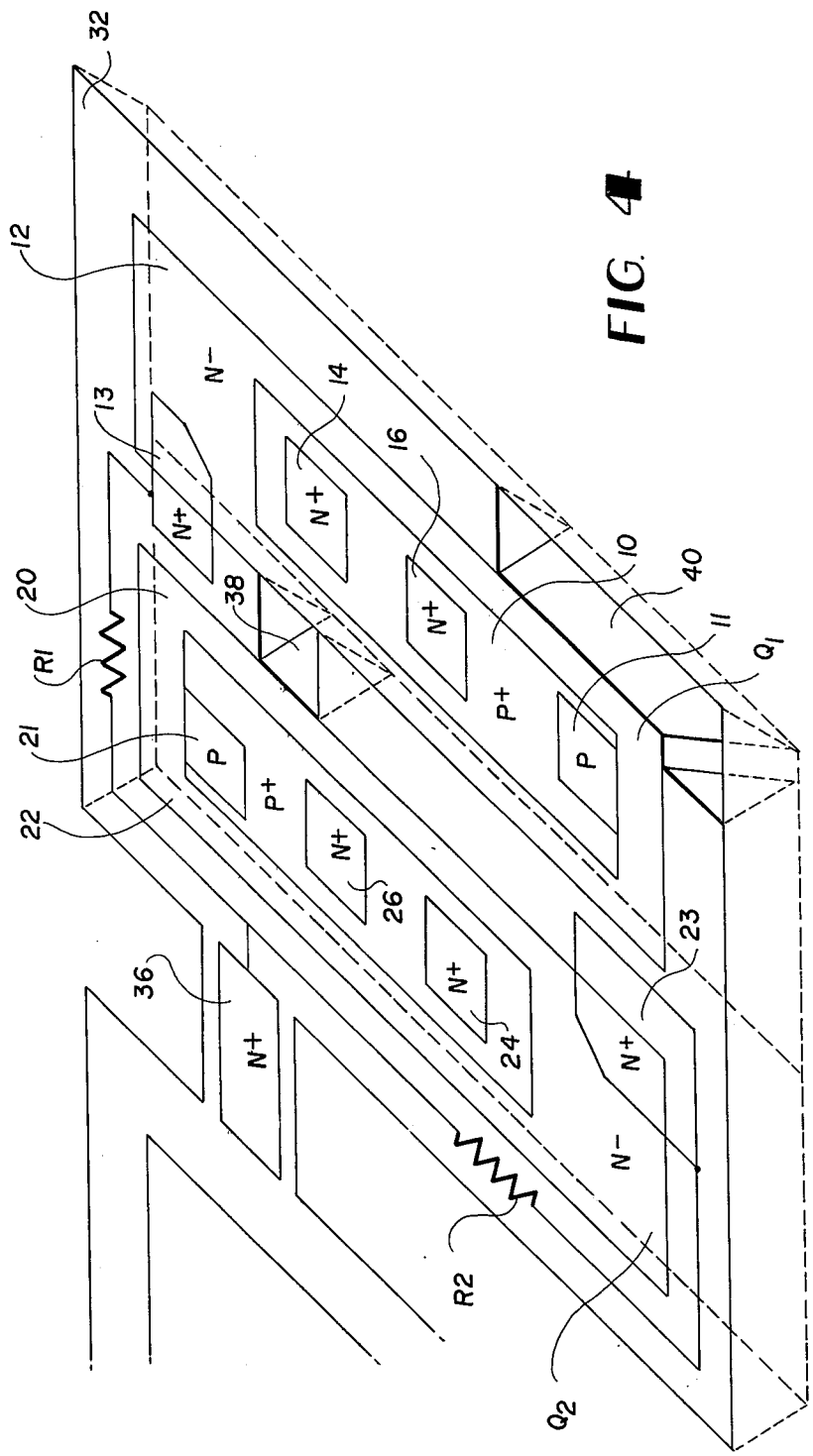
FIG. 3
FIG. 4

MOAT RESISTOR RAM CELL

BACKGROUND OF THE INVENTION

The present invention relates generally to RAM memory cells and more specifically to forming the load resistors of the RAM cells.

Area has always been a prime consideration in the formation of integrated circuits especially memory cells since they form a part of an overall matrix. In addition to the surface area needed for the formation of the integrated circuits, or memory cells themselves, the overall layout is also a function of the metallization pattern for the interconnection of the cells to each other and to external circuits. One solution to reduce the surface metallization pattern, is to use the isolation moats as conductors by filling them with metallic material. Typical examples are U.S. Pat. Nos. 3,932,927 and 4,037,306. Similarly, the connection between metallized patterns on both surfaces of the substrate and buried layers using conductive semiconductive material in the isolation moats are illustrated in U.S. Pat. Nos. 3,462,650 and 3,913,124. The connection to buried layers in dielectrically isolated circuits using polycrystalline conductors is illustrated in U.S. Pat. No. 3,858,237.

Although the prior art has recognized the use of the moats in dielectrical isolation as conductors, it has failed to recognize the use of the moats as resistors in an integrated circuit and more specifically as the load resistors in a RAM cell. The prior art generally forms the load resistors of RAM cells as pinched resistors in epitaxial layers or as pinch base resistors. Each of these pinched resistors requires a surface area and thus does not necessarily use space effectively.

SUMMARY OF THE INVENTION

The present invention is a RAM cell wherein the two load resistors constitute the doped polycrystalline semiconductor moat which forms a part of the dielectric isolation barriers. The moat separates and surrounds the lateral edges of the two transistors of the RAM cell formed in adjacent wells. Dielectric insulation separates the doped polycrystalline silicon from the wells. The wells and the doped polycrystalline moats have the same conductivity type and a common surface contact is made between adjacent areas of the well and the moat. The moat forms a pair of resistors connected at one end to a common point and are disconnected at their other ends by a discontinuity in the moat. The discontinuity prevents a conduction path between the contact areas of the two well areas.

Two levels of interconnects are provided interconnecting areas of the cell to each other and to adjacent cells. The first level includes: an interconnect bridging the common contact area of the substrate well and moat resistor and interconnecting it to the base of the other well; an interconnect interconnecting a first emitter of each well to each other and to adjacent cells; an interconnect parallel to the emitter interconnect interconnecting the connected ends of the moat resistors to adjacent cells; and individual contacts for second emitters in each well. The second level of interconnects include two parallel interconnects orthogonal to the interconnect of the first emitters for interconnecting the second emitter contacts to adjacent cells. The two levels of interconnects and contacts are separated from each other and the integrated circuit by dielectric insulation.

The method of fabricating the moat resistors of the present invention includes forming an epitaxial layer of a first conductivity type on a substrate of a second conductivity type, forming moats in the expitaxial layer which extend into the substrate, forming dielectric insulation on the epitaxial surface and in the moats, filling the moats with doped polycrystalline semiconductor material, polishing the wafer surface until polycrystalline material is contained only in the moat regions. Portions of the polycrystalline material in the moats are removed so as to create a pair of moat resistors connected at one end and disconnected at the other end. Transistors are formed in the well regions. Interconnects are formed bridging adjacent portions of the moat resistors and connecting the bridge portion to the base region of the transistor in the adjacent well. Additional interconnects are formed in two levels to provide for connection of the cell to common control lines in a matrix.

OBJECTS OF THE INVENTION

An object of the present invention is to provide a RAM cell which incorporates moat load resistors.

Another object is to provide load resistors for RAM cells which would require a minimum of additional processing over the formation of the dielectric isolation.

A further object of the invention is to provide a RAM cell which requires almost no additional space for the formation of the load resistors.

A still further object is to provide a RAM cell with moat resistors which reduces the area required for two level interconnects.

Other objects, advantages, and novel features of the invention will become apparent from the following detailed description of the invention when considered in conjunction with the accompanying drawings.

BRIEF DESCRIPTION OF THE DRAWINGS

FIG. 3 is a cross-sectional view taken along lines 3—3 of FIG. 2.

FIG. 4 is a prospective view of FIG. 2 without the interconnects.

DESCRIPTION OF THE PREFERRED EMBODIMENTS

Figure 1:
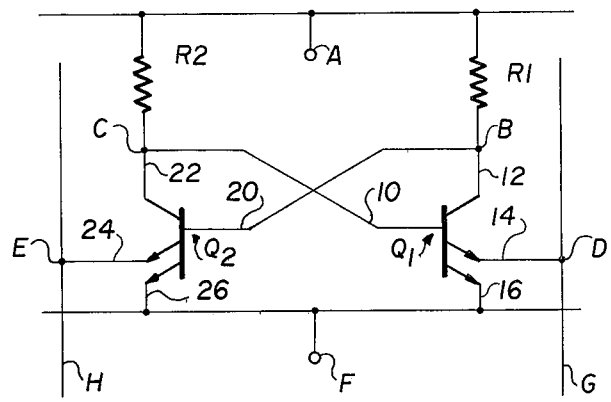
FIG. 1 is a schematic of a RAM cell.
Figure 2:
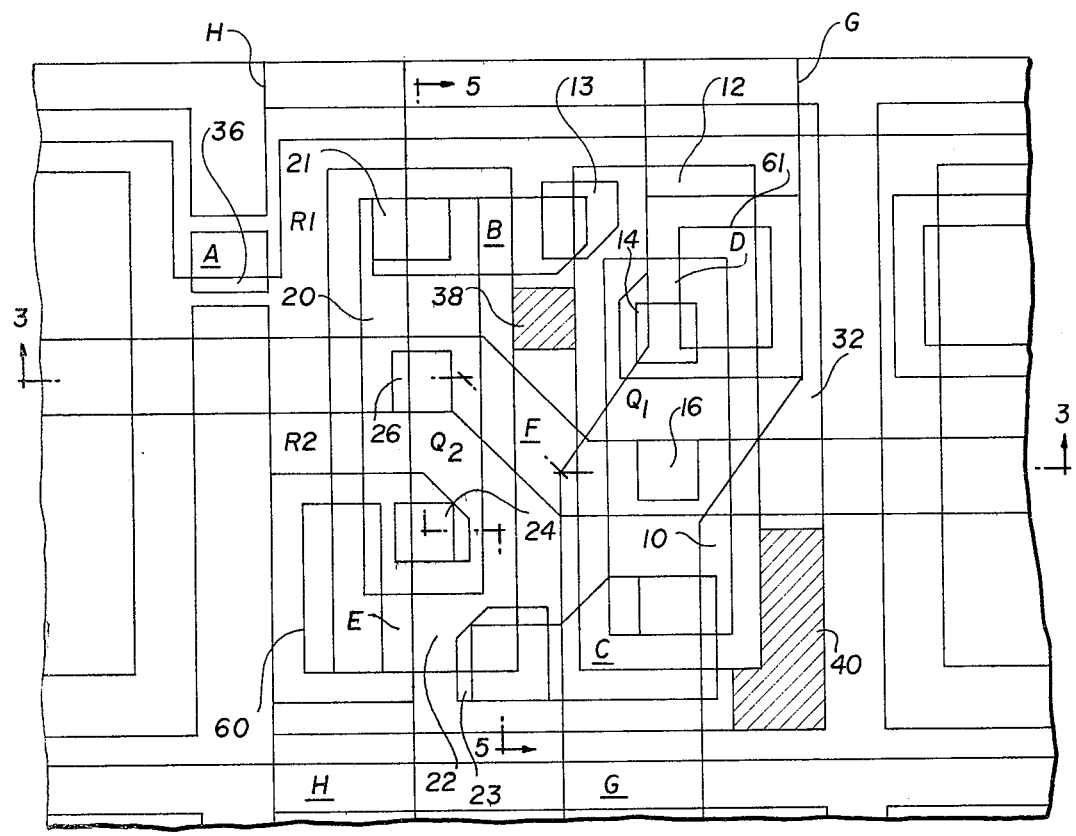
FIG. 2 is a topological view of a RAM cell incorporating the principles of the present invention having moat load resistors.

FIG. 1, which illustrates a RAM cell having transistors $Q_1$ and $Q_2$ and load resistors $R_1$ and $R_2$, respectively. A common word line A makes contact to one end of the two resistors $R_1$ and $R_2$. The other end of resistors $R_1$ is connected by interconnect B to the collector 12 of $Q_1$ and the base 20 of $Q_2$. Similarly, the other end of resistor $R_2$ is connected by interconnect C to the collector 22 of $Q_2$ and the base 10 of $Q_1$. Line F constitutes a common emitter line connected to the emitters 16 and 26 of transistor $Q_1$ and $Q_2$, respectively. A second emitter 14 of $Q_1$ is connected to a separate emitter line D and a second emitter 24 of transistor $Q_2$ is connected to a separate emitter line E.

The specific implementation of the circuit schematic of FIG. 1 into an integrated circuit incorporating the principles of the present invention is illustrated in FIGS. 2-5. The interconnect B bridges a portion of the collector 12 of transistor $Q_1$ and adjacent area of the moat resistor $R_1$ at a common contact region 13 and is further connected to the base contact region 21 of transistor $Q_2$. Similarly, the interconnect C bridges adjacent areas of the collector 22 of transistor $Q_2$ and the moat resistor $R_2$ at common contact region 23 and is further connected to base contact region 11 of transistor $Q_1$. The surface contact regions 13 and 23 are illustrated also in FIG. 4. Interconnect F for common emitters 26 and 16 and the common resistor or word line A are essentially parallel to each other. Emitter contacts D and E which are essentially parallel to each other and orthogonal to the common resistor and common emitter interconnects A and F, respectively. The contacts and interconnects A-F form a first level of metallization. Lines G and H, which are orthogonal to A and F, are connected to contacts D and E and form a second level of metallization. A layer of insulative material 30 separates the two levels of metallization from each other. Openings 60 and 61 in the insulative layer 30 connect the second level, G and H, metal to the first level metal at D and E.

The resistors $R_1$ and $R_2$ comprise polycrystalline semiconductive material moats 32 which are doped with the same conductivity type as the collector regions 12 and 22 of the transistors $Q_1$ and $Q_2$. The common moat for resistors $R_1$ and $R_2$ are connected to the interconnect A at contact area 36. The portions of the doped polycrystalline moat material are removed at 38 and 40 to form a discontinuity so as to prevent a collector to collector resistance path through the moat between collectors 12 of transistor $Q_1$ and 22 of collector $Q_2$. The impurity concentration of the moat determines the value of the resistors and to a lessor extent, the placement of contacts B and C also effect the value of the resistors.

It should be noted that none of the interconnects pass over the voids 38 and 40 in the moat.

Figure 5:
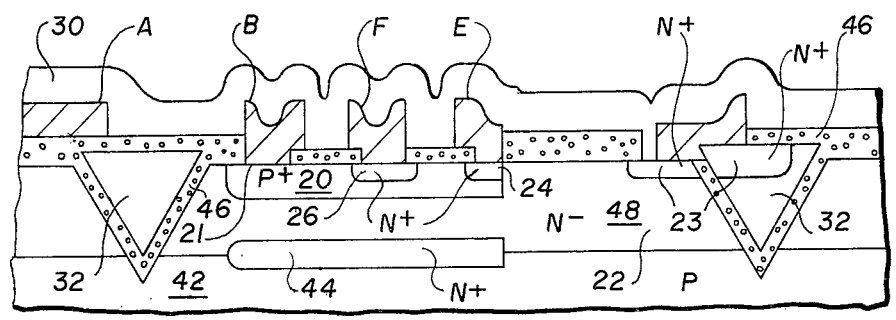
FIGS. 5 is a cross-sectional view taken along lines 5—5 of FIG. 2 illustrating the method of fabrication of the RAM cell incorporating the principles of the present invention as illustrated in FIGS. 2-4.

The process of fabrication begins with a wafer of semiconductor material 42 having, for example, P-type conductivity. This material may, for example, be silicon having a resistivity of 1 ohm-centimeter. As illustrated in FIGS. 3 and 5, buried layer $N^+$ regions 44 are conventionally formed and an N-type epitaxial layer 48 is grown to form collectors 12 and 22. A mask is applied to the top surface of the wafer and moat regions 45 are formed therein by, for example, etching. The moats and the top surface of the wafer 42 are covered by a layer of insulation 46 which may be, for example, silicon dioxide formed by oxidizing the wafer surface. After forming the insulative layer 46, the moats 45 are then filled with polycrystalline semiconductor material being doped with impurities of the same conductivity type as the epitaxial layer 48. The doped polycrystalline material may be formed by vapor growth. The surface of the wafer is then polished until the doped polycrystalline material is contained only in the moat regions as structure 32. The substrate at this stage is oxidized to form an insulative layer over the polycrystalline material as an extension of insulation 46.

A mask is formed to delineate portions 38 and 40 of the doped polycrystalline material which are then removed by, for example, etching. This provides a plurality of wells or surface regions of the wafer laterally separated by moat regions 45 and are isolated from each other by the insultative layer 46. Additionally a plurality of doped polycrystalline materials regions in the moat are made to be discontinuous from one another except where an electrical common point exists, and form the resistors of the cell.

The transistors $Q_1$ and $Q_2$ are then formed in well regions 12 and 22 respectively of layer 48. A mask is formed over the substrate to delineate and expose the areas in which the base regions are to be formed. Impurities are introduced and diffused into the substrate through the mask apertures to form $P^+$ base regions 10 and 20. Next a mask layer is applied and delineated to expose the areas in which the emitter contact regions and common collector-moat resistor contact regions are to formed. The etchant used for the delineation removes only the insulative layer 46 and not the substrate nor the polycrystalline moats. A cross-section for transistor $Q_2$ is illustrated in FIG. 5. Note the discontinuity under contact C. Impurities are introduced and diffused to form $N^+$ emitter regions 14, 16 and 24, 26, common collector-moat resistor contact regions 13 and 23 of transistors $Q_1$ and $Q_2$ respectively, and common moat resistor contact region 36. The emitter, common collector-moat resistor, and common moat resistor contact regions, are washed to remove any oxide formed during the diffusion and apertures are formed in the oxide 30 to expose base contact regions 11 and 21 of the transistors $Q_1$ and $Q_2$ respectively.

A first layer of metal is applied and delineated to form first level interconnects A, B, C, and F and contacts D and E. A second layer of insulation is deposited and openings are made to expose contacts D and E. A second layer of metal is applied and delineated to form parallel lines G and H contacting D and E respectively which are orthogonal to lines A and F. It should be noted that no metal is allowed to pass over the regions 38 and 40 where the doped polycrystalline material 32 has been removed from the moat.

From the preceding description of the preferred embodiments, it is evident that the objects of the invention are obtained by a RAM cell having moat resistors. Although the invention has been described and illustrated in detail, it is to be clearly understood that the same is by way of illustration and example only and is not to be taken by way of limitation. The spirit and scope of this invention is to be limited only by the terms of the appended claims.

What is claimed:

1. An integrated semiconductor structure comprising:
   a body of semiconductor material;
   a first transistor having an emitter region, a base region and a collector region formed in said body;
   a second transistor having an emitter region, a base region and a collector region formed in said body;
   dielectric walls isolating laterally said first and second transistors from each other;
   a polycrystalline semiconductor moat surrounding the lateral walls of said first and second transistors and isolated therefrom by said dielectric walls and forming a pair of resistors;
   means for selectively interconnecting the regions of said first and second transistors and said polycrystalline moat resistors; and
   said polycrystalline moat being discontinuous to define said pair of resistors being connected at one end to a common point in said moat and disconnected at their other ends to prevent a low resistance path between the regions of said first and second transistors which are interconnected to a respective moat resistor.

2. The structure of claim 1 wherein said interconnecting means includes first means for interconnecting a first portion of one of said polycrystalline moat resistors, said collector region of said first transistor and said base region of said second transistor and second means for interconnecting a first portion of the other of said polycrystalline moat resistors, said collector region of said second transistor and said base region of said first transistor.

3. The structure of claim 2 wherein said polycrystalline moat is discontinuous to prevent a collector to collector or resistance path through said polycrystalline moat while permitting a resistance path between each collector region and a common terminal through a respective polycrystalline moat resistor.

4. The structure of claim 2 wherein said polycrystalline moat is doped with impurities of the same conductivity type as the collector regions and said first and second means each contact adjacent areas of a respective collector region and polycrystalline moat resistor.

5. The structure of claim 2 wherein said first and second transistors each include a second emitter region, and said interconnecting means further include third means for interconnecting said second emitter regions.

6. The structure of claim 1 wherein said polycrystalline moat is doped with impurities of the same conductivity type as said collector regions and said interconnecting means contact adjacent areas of a collector region and a respective polycrystalline moat resistor.

7. The structure of claim 6 wherein said adjacent areas of said collector region and a respective resistor is heavily doped with impurities for forming an ohmic contact with said interconnecting means.

8. A RAM cell comprising:
a body of semiconductor material;
a first transistor having an emitter region, a base region and a collector region formed in said body;
a second transistor having an emitter region, a base region and a collector region formed in said body;
a load resistor for and connected to each of said transistors formed of doped polycrystalline semiconductor material as a common moat in said body surrounding the lateral walls of said transistor connected at one end to a common point in a common moat and disconnected at their other end by a discontinuity in said common moat to prevent a low resistance path between the regions of said first and second transistors which are connected to a respective load resistor; and
dielectric isolation between said transistors and said load resistors.

9. The RAM cell of claim 8 wherein said resistors are connected at one end to a common point in a common moat structure and are disconnected at their other end by a discontinuity in the common moat.

10. The RAM cell of claim 8 including a first means for connecting said emitters of said cell to each other and to emitters of adjacent cells and a second means parallel to said first means and connected to said common point of said resistors for connecting said resistors to resistors of adjacent cells.

11. The RAM cell of claim 10 wherein said first and second transistors each include a second emitter region, and including a third and fourth means parallel to each other and substantially orthogonal to said first and second means for connecting a respective second emitter to a second emitter of adjacent cells.

12. The RAM cell of claim 11 wherein said first and second means are separated from said body by a layer of insulation to form a first level and said third and fourth means are separated from said first and second means by a layer of insulation to form a second level.

13. The RAM cell of claim 12 wherein said first level includes a contact connected to each of said second emitters and said third and fourth means are connected to a respective first level contact.

14. The RAM cell of claim 8 wherein said collector region is connected to a respective load resistor by a common contact bridging adjacent area of said collector region and said moat.

15. The RAM cell of claim 14 wherein each of said common contacts is further connected to the base region of the other transistor by an interconnect.

16. The structure of claim 1 wherein said moat separates the adjacent lateral walls of said first and second transistor and encompasses the non-adjacent walls of said first and second transistors in a common moat.

17. The RAM cell of claim 8 wherein said moat separates the adjacent lateral walls of said first and second transistor and encompasses the non-adjacent walls of said first and second transistors in said common moat structure.

* * * * *

UNITED STATES PATENT AND TRADEMARK OFFICE
CERTIFICATE OF CORRECTION

PATENT NO. : 4,231,056
DATED : October 28, 1980
INVENTOR(S) : David L. Taylor

It is certified that error appears in the above-identified patent and that said Letters Patent are hereby corrected as shown below:

Column 2, line 49, delete "FIGS." and insert therefor --FIG.--.

Column 4, line 3, delete "materials" and insert therefor -- material --.

Column 4, line 16, delete "to".

*Signed and Sealed this*

*Tenth* Day of *March 1981*

[SEAL]

*Attest:*

RENE D. TEGTMEYER

*Attesting Officer*     *Acting Commissioner of Patents and Trademarks*